(12) United States Patent
Tanaka et al.

(10) Patent No.: US 10,303,810 B2
(45) Date of Patent: May 28, 2019

(54) PROBLEM STRUCTURE EXTRACTION SUPPORT SYSTEM, PROBLEM STRUCTURE EXTRACTION SUPPORT METHOD, AND PROGRAM

(71) Applicant: HITACHI, LTD., Tokyo (JP)

(72) Inventors: Erika Tanaka, Tokyo (JP); Haruko Yakabe, Tokyo (JP); Hiroaki Nasu, Tokyo (JP)

(73) Assignee: HITACHI, LTD., Tokyo (JP)

( * ) Notice: Subject to any disclaimer, the term of this patent is extended or adjusted under 35 U.S.C. 154(b) by 562 days.

(21) Appl. No.: 14/644,295

(22) Filed: Mar. 11, 2015

(65) Prior Publication Data
US 2016/0019318 A1     Jan. 21, 2016

(30) Foreign Application Priority Data
Jul. 16, 2014  (JP) ................... 2014-146282

(51) Int. Cl.
| G06F 7/60 | (2006.01) |
| G06F 17/10 | (2006.01) |
| G06F 17/50 | (2006.01) |
| G06Q 10/06 | (2012.01) |

(52) U.S. Cl.
CPC ............ *G06F 17/50* (2013.01); *G06Q 10/06* (2013.01)

(58) Field of Classification Search
None
See application file for complete search history.

(56) References Cited

FOREIGN PATENT DOCUMENTS
JP     2012113537 A  *  6/2012

OTHER PUBLICATIONS

Binder, Thomas et al., "Developing System Dynamics Models from Causal Loop Diagrams", Jul. 25, 2004, Proceedings of the 22nd International Conference of the System Dynamic Society. (Year: 2004).*

* cited by examiner

*Primary Examiner* — Cedric Johnson
(74) *Attorney, Agent, or Firm* — Volpe and Koenig, P.C.

(57) ABSTRACT

An object of the present invention is to enable extraction of more structures having a possibility including problems. A problem structure extraction support system extracts multiple loop structures from an evaluation model, replaces a common portion which includes nodes and links in series common to the multiple loop structures by one of the nodes included in the common portion, and determines the reference models corresponding to the multiple loop structures.

4 Claims, 15 Drawing Sheets

| ID | IN CASE OF NODE | IN CASE OF LINK | |
|---|---|---|---|
| | NODE NAME | LINK TYPE | DELAY FLAG |
| Link_1 | | -1 | 0 |
| Node_1 | NUMBER OF TIMES OF REPAIR | | |
| Link_2 | | 1 | 0 |
| Node_2 | FREQUENCY OF FAILURE | | |
| ⋮ | ⋮ | ⋮ | ⋮ |

FIG. 3

| MODEL NAME | MODEL DRAWING |
|---|---|
| SUCCESS TO THE SUCCESSFUL | R1: SUCCESS OF A → ALLOCATION TO A INSTEAD OF B → RESOURCES TO A (loop). n1. R2: SUCCESS OF B → ALLOCATION TO A INSTEAD OF B → RESOURCES TO B (loop). |

| CONTACTING LOOPS | | CONTACT NODE | LINK CONFIGURATION OF CONTACT NODE |
|---|---|---|---|
| R1 | R2 | n1 | {Rout,Rin,Rout,Rin} |

| STORY OF PROBLEM LIKELY TO OCCUR |
|---|
| PATTERN WHEREIN, IN ENVIRONMENT WHERE MULTIPLE INDIVIDUALS, GROUPS, OR OTHERS COMPETE FOR LIMITED RESOURCES, WHEN ONE STARTS TO SUCCEED, SUCCESSFUL ONE OBTAINS MORE RESOURCES AND TAKES RESOURCES AND CHANCES OF SUCCESS AWAY FROM OTHERS, THEREBY GIVING RISE TO POSSIBILITY OF SUCCESS CONTINUING. |

| MODEL NAME | MODEL DRAWING |
|---|---|
| SHIFTING THE BURDEN | SYMPTOMATIC SOLUTION (n3); PROBLEM SYMPTOM (n1); FUNDAMENTAL SOLUTION (n2); SIDE EFFECT; loops B1, B2, R1. |

| CONTACTING LOOPS | | CONTACT NODE | LINK CONFIGURATION OF CONTACT NODE |
|---|---|---|---|
| B1 | B2 | n1 | {Bout,Bin,Bout,Bin} |
| B2 | R1 | n1 | {Bout,RBin,Rout} |
| | | n2 | {RBout,Bin,Rin} |
| B1 | R1 | n1 | {RBout,Bin,Rin} |
| | | n3 | {Bout,Rout,RBin} |

| STORY OF PROBLEM LIKELY TO OCCUR |
|---|
| PATTERN WHEREIN, SINCE SYMPTOM OF PROBLEM TEMPORARILY DISAPPEARS BY PERFORMING PALLIATIVE TREATMENT ON PROBLEM, MOTIVATION TO IMPLEMENT MORE FUNDAMENTAL SOLUTION FALLS. WHEN SYMPTOM REAPPEARS, PALLIATIVE TREATMENT IS PERFORMED AGAIN AND INTEREST ON FUNDAMENTAL SOLUTION WANES. |

FIG. 6

| MODEL NAME | PATTERN ID | LOOP ID | NODE NUMBER | DELAY LINK NUMBER | MATCH FLAG |
|---|---|---|---|---|---|
| SHIFTING THE BURDEN | Pattern_2 | Loop_1, Loop_2, Loop_4 | 7 | 0 | 1 |
| FIXES THAT FAIL | Pattern_4 | Loop_1, Loop_3 | 4 | 1 | |
| FIXES THAT FAIL | Pattern_5 | Loop_1, Loop_2 | 7 | 0 | 1 |
| FIXES THAT FAIL | Pattern_6 | Loop_2, Loop_4 | 7 | 0 | 0 |
| ESCALATION | Pattern_7 | Loop_1, Loop_4 | 6 | 0 | |
| TRAGEDY OF THE COMMONS | | | | | |
| DRIFTING GOALS | Pattern_7 | Loop_1, Loop_4 | 6 | 0 | |
| LIMITS TO SUCCESS | Pattern_3 | Loop_3, Loop_4 | 8 | 1 | |
| LIMITS TO SUCCESS | Pattern_5 | Loop_1, Loop_2 | 7 | 0 | |

FIG. 7

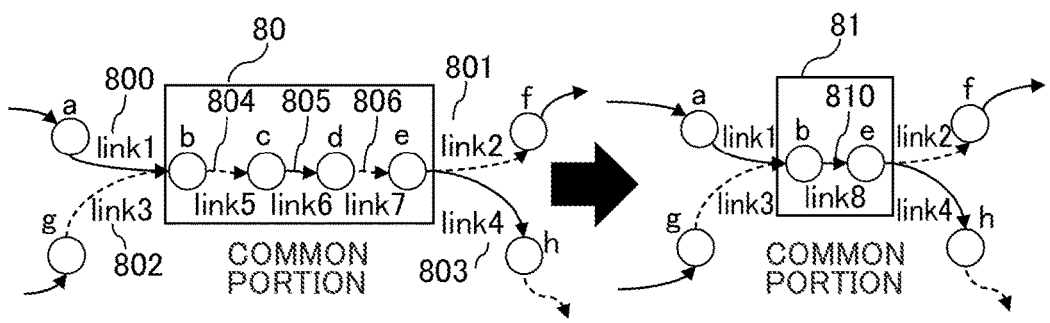

CALCULATION OF TYPE OF LINK BETWEEN NODE b AND NODE e
VALUES ASSIGNED TO TYPES OF LINKS FOLLOWING NODE b UNTIL REACHING NODE e ARE MULTIPLIED TOGETHER.
TYPE OF LINK 804 FROM NODE b TO NODE c IS "−1",
TYPE OF LINK 805 FROM NODE c TO NODE d IS "1",
TYPE OF LINK 806 FROM NODE d TO NODE e IS "−1".
HENCE, TYPE OF LINK CONNECTING NODE b AND NODE e IS
(−1) × 1 × (−1) = "1".

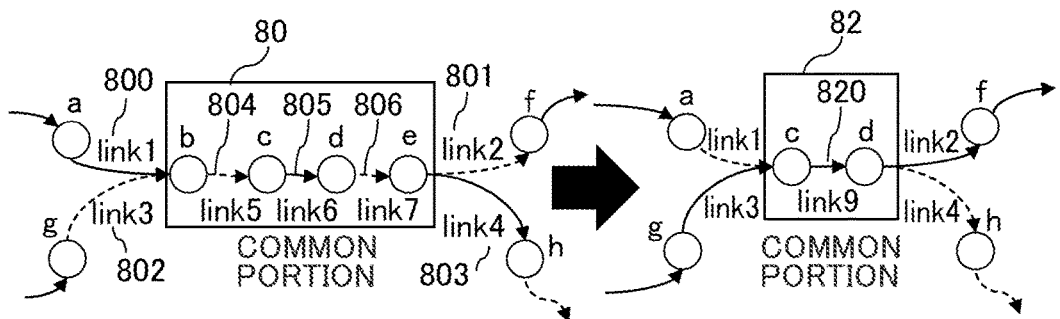

CALCULATION OF TYPE OF link 1
"1" WHICH IS TYPE OF link 1 × "−1" WHICH IS TYPE OF LINK EXISTING IN COMMON PORTION BEFORE c = "−1"
*IN CASE WHERE MULTIPLE LINKS EXIST IN COMMON PORTION BEFORE c, VALUES OF LINKS ARE ALL MULTIPLIED TOGETHER.

CALCULATION OF TYPE OF link 2
"−1" WHICH IS TYPE OF LINK EXISTING IN COMMON PORTION AFTER d × "−1" WHICH IS TYPE OF link 2 = "1"

CALCULATION OF TYPE OF link 3
"−1" WHICH IS TYPE OF link 3 × "−1" WHICH IS TYPE OF LINK EXISTING IN COMMON PORTION BEFORE c = "1"

CALCULATION OF TYPE OF link 4
"−1" WHICH IS TYPE OF LINK EXISTING IN COMMON PORTION AFTER d × "1" WHICH IS TYPE OF link 4 = "−1"

CALCULATION OF TYPE OF LINK BETWEEN NODE c AND NODE d
VALUES ASSIGNED TO TYPES OF LINKS FOLLOWING NODE b UNTIL REACHING NODE e ARE MULTIPLIED TOGETHER AND RESULT IS "1"

FIG. 14

PROBLEM STRUCTURE EXTRACTION SUPPORT SYSTEM, PROBLEM STRUCTURE EXTRACTION SUPPORT METHOD, AND PROGRAM

CROSS-REFERENCE TO RELATED APPLICATION

The present application claims the benefit of priority pursuant to 35 U.S.C. § 119(a) to Japanese Patent Application No. 2014-146282, filed on Jul. 16, 2014, the entire disclosure of which is hereby incorporated herein by reference.

BACKGROUND OF THE INVENTION

1. Field of the Invention

The present invention relates to a problem structure extraction support system, a problem structure extraction support method, and a program.

2. Related Art

Japanese Patent Application Publication No. 2012-113537 describes a system which extracts a loop structure from a model and performs matching with the characteristics of a structure of a system archetype to find out risk factors without depending on past similar cases, thereby efficiently extracting potential risk structures.

However, the system described in Japanese Patent Application Publication No. 2012-113537 performs matching between the loop structure and the system archetype having the same loop length as the loop structure. Accordingly, for example, when redundant nodes are included in the loop structure, the matching fails and the problem cannot be extracted.

SUMMARY OF THE INVENTION

The present invention has been made in view of the background described above, and an object thereof is to provide a problem structure extraction support system, a problem structure extraction support method, and a program which are capable of extracting more structures having a possibility including problems.

A main aspect of the present invention for solving the problems described above is a problem structure extraction support system which supports extraction of problem structures from an evaluation model being a directed graph including nodes and links, comprising a loop structure extraction part configured to extract a plurality of loop structures from the evaluation model, a reference model storage part configured to store reference models expressing the problem structures, a matching processing part configured to determine the reference model corresponding to each of the plurality of loop structures, wherein the matching processing part replaces a common portion of each of the plurality of loop structures which includes some of the nodes and the links in series by one or more of the nodes therein, the common portion being shared by a plurality of loops of each of the plurality of the loop structures.

Other problems and methods for solving the problems disclosed in this application will be made clear in the section of the embodiment of the invention and the drawings.

The present invention can extract more structures having a possibility including problems.

BRIEF DESCRIPTION OF THE DRAWINGS

FIG. 3 is a view showing a configuration example of an element data table.

FIG. 6 is a view showing a configuration example of a reference model data table.

FIG. 7 is a view showing a configuration example of a matching data table.

FIG. 14 is a flowchart showing a flow of processing of changing the type of a link coupled to a contact node.

DETAILED DESCRIPTION OF THE INVENTION

Figure 1:
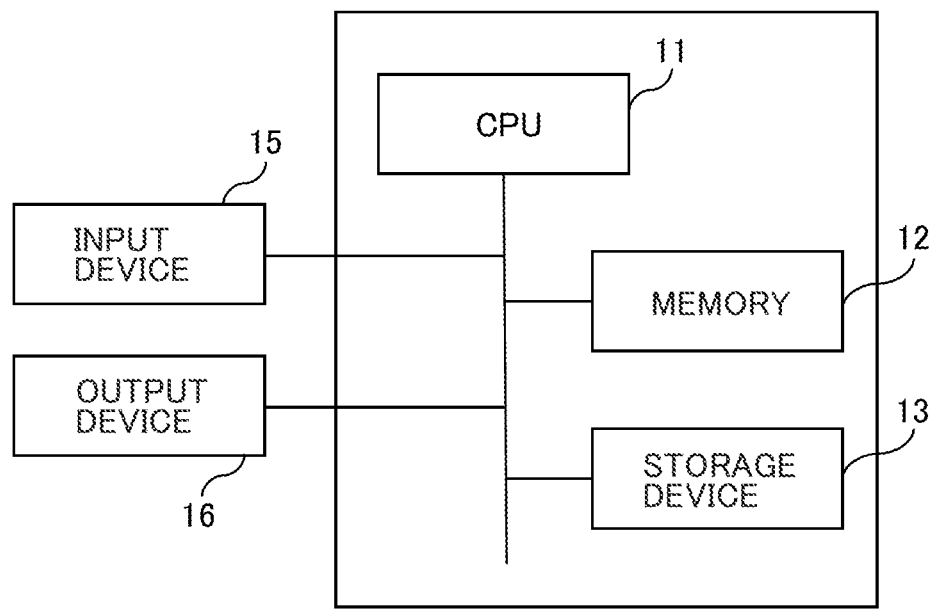
FIG. 1 is a view showing a hardware configuration example of the problem structure extraction support system.

A problem structure extraction support system of an embodiment of the present invention analyzes a complex system which change over time such as an industrial system or a social system as a target, and supports work of extracting a problem structure from a model of the analysis target system, the model obtained by modeling the system with a causal loop diagram (hereafter referred to as CLD).

The CLD is a diagram method for expressing causal relationships among elements forming the system. The CLD is used to model causal relationships among elements in, for example, system dynamics proposed by J. W. Forrester of Massachusetts Institute of Technology, the system dynamics being a method of analyzing changes over time in the system (reference URL; http://www.hitachi.co.jp/rd/portal/glossary/jp_i/ingaruupuzu.html). The CLD is created by setting elements which affect the system as nodes and connecting anode of cause and a node of effect by a link shown by an arrow. There are four types of arrows: an arrow (hereafter, referred to as positive correlation link) expressing a positive correlation in which, when a value of the node of cause increases, the value of the node of effect also increases or, when the value of the node of cause decreases, the value of the node of effect also decreases; and an arrow (hereafter, referred to as positive correlation link (delay)) expressing a case where the causal relationship between the nodes emerges not immediately but after a certain time elapses; an arrow (hereafter, referred to as negative correlation link) expressing a negative correlation in which, when the value of the node of cause increases, the value of the node of effect decreases or, when the value of the node of cause decreases, the value of the node of effect increases; and an arrow (hereafter, referred to as negative correlation link (delay)) expressing a case where the causal relationship between the nodes emerges not immediately but after a certain time elapses. Portions forming loops (hereafter, referred to as loop structures) are sometimes included in the CLD. The loop structures are distinguished into balancing loop and reinforcing loop. The balancing loop is a loop in which a variable being an element of the loop structure gradually converges to a certain value, and a loop structure is determined to be the balancing loop when an odd number of negative correlation links exist in the loop structure. The reinforcing loop is a loop in which a variable being an element of the loop structure gradually or abruptly increases or decreases and diverges, and a loop structure is determined to be the reinforcing loop when no or even number of negative correlation links exist in the loop structure.

The problem structure extraction support system of the embodiment extracts the loop structure from the CLD (hereafter referred to as evaluation model) obtained by modeling the analysis target system by using the nodes and links described above, and performs pattern matching between the extracted loop structure and a reference model. The reference model is a pattern of the CLD obtained by extracting, for example, a structure likely to result in a failure and the like from past analysis results, and includes one or more loop structures. In the field of system dynamics, several patterns (which are called system archetypes) are known as basic models of system thinking. In the embodiment, the system archetypes are used as the reference model. When the loop structure extracted from the CLD matches the reference model, the problem structure extraction support system can determine that the analysis target system has a possibility of including the problem structure.

In the pattern matching, when one loop structure is formed of a combination of multiple loop structures and multiple nodes (and links coupling these nodes) are included in a portion common to the multiple loop structures, the problem structure extraction support system of the embodiment replaces this common portion by one node and performs the matching with the reference model. The problem structure extraction support system can thereby perform the matching with the reference model even when redundant nodes are included in the loop structure extracted from the evaluation model, and effectively extract a potential risk structure.

FIG. 1 is a view showing a hardware configuration example of the problem structure extraction support system. As shown in FIG. 1, the problem structure extraction support system can be implemented by a computer including a CPU 11, a memory 12, a storage device 13, an input device 15, and an output device 16. The storage device 13 is, for example, a hard disk drive, a solid-state drive, a flash memory, or the like which stores various types of data and programs. The CPU 11 implements various functions by reading the programs stored in the storage device 13 out to the memory 12 and executing the programs. The input device 15 is, for example, a keyboard, a mouse, a track ball, a touch panel, a microphone, or the like which accepts input of data. The output device 16 is, for example, a display, a printer, a speaker, or the like which outputs data. The problem structure extraction support system may include multiple input devices 15 and multiple output devices 16.

Figure 2:
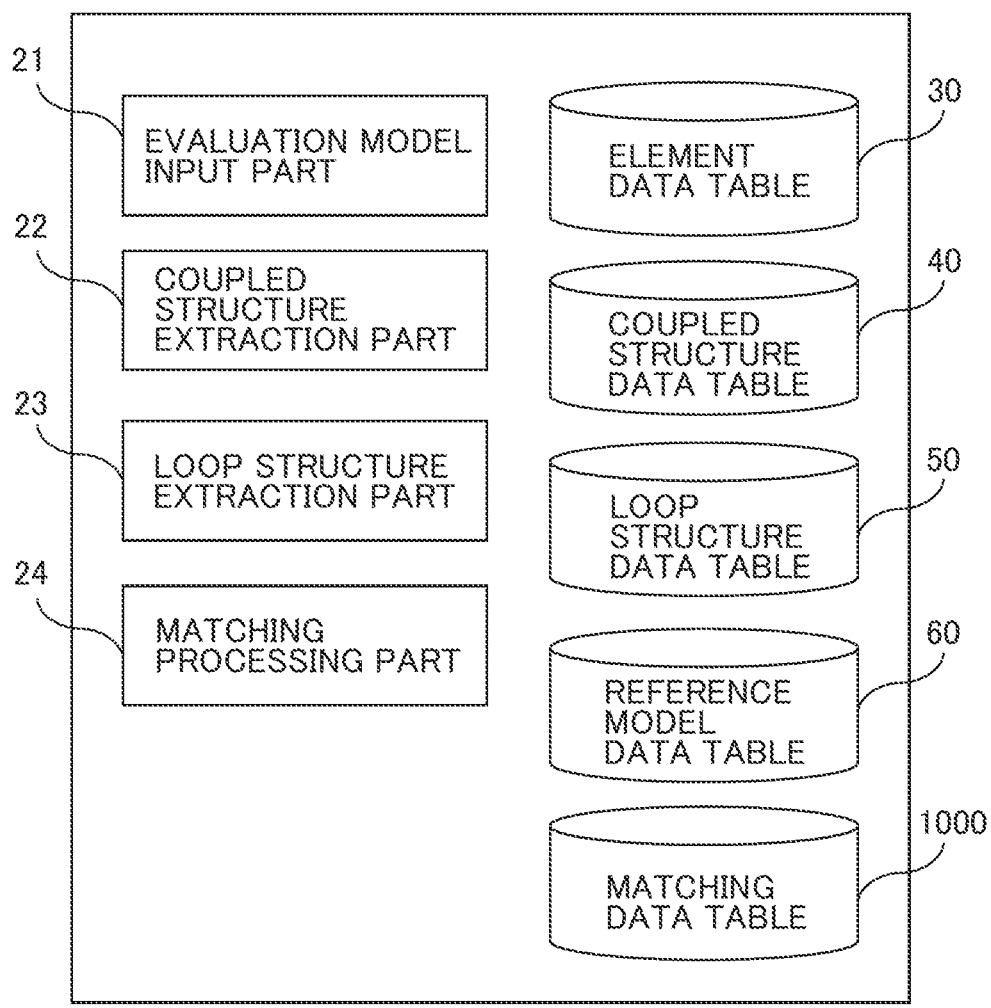
FIG. 2 is a view showing a software configuration example of the problem structure extraction support system.

FIG. 2 is a view showing a software configuration example of the problem structure extraction support system. As shown in FIG. 2, the problem structure extraction support system includes an evaluation model input part 21, a coupled structure extraction part 22, a loop structure extraction part 23, a matching processing part 24, an element data table 30, a coupled structure data table 40, a loop structure data table 50, a reference model data table 60, and a matching data table 1000. Note that the evaluation model input part 21, the coupled structure extraction part 22, the loop structure extraction part 23, and the matching processing part 24 are implemented by causing the CPU 11 to read the programs stored in the storage device 13 out to the memory 12 and execute the programs. Meanwhile, the element data table 30, the coupled structure data table 40, the loop structure data table 50, the reference model data table 60, and the matching data table 1000 are implemented as part of storage regions provided by the memory 12 and the storage device 13.

The element data table 30 stores information (hereafter referred to as element information) on elements forming the CLD. FIG. 3 is a view showing a configuration example of the element data table 30. An ID field 300 stores information (hereafter, referred to as node ID) for identifying the nodes or information (hereafter, referred to as link ID) for identifying the links. When an element is a node, a name given to the node is stored in a node name field 3010. When an element is a link and the link is the positive correlation link, "1" is stored in a link type field 3020. When an element is a link and the link is the negative correlation link, "−1" is stored in the link type field 3020. When the link has a delay, "1" is stored in a delay flag field 3021. When the link has no delay, "0" is stored in the delay flag field 3021.

Figure 4:
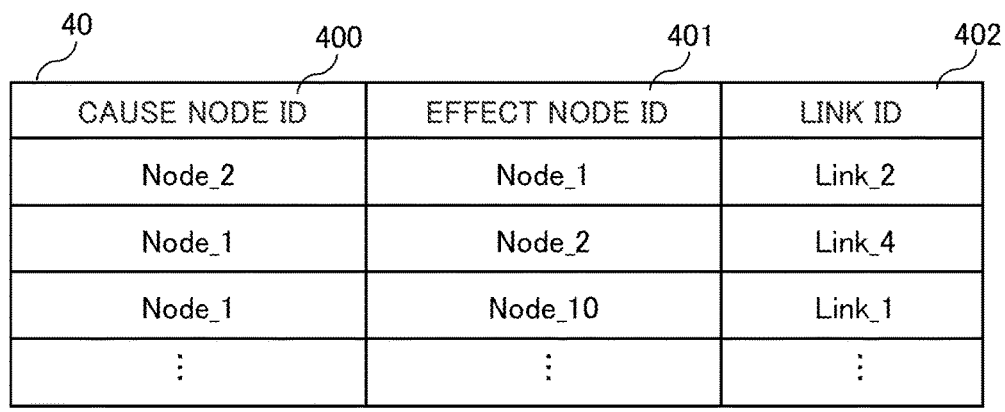
FIG. 4 is a view showing a configuration example of a coupled structure data table.

The coupled structure data table 40 stores information (hereafter, referred to as coupled structure information) showing a coupling relationship between each pair of two nodes. FIG. 4 is a view showing a configuration example of the coupled structure data table 40. Out of two nodes coupled to each other by a directed link, a node coupled on a starting point side of the link is referred to as cause node and a node coupled to a terminal point side of the link is referred to as effect node. In this case, identification information (hereafter, referred to as node ID) indicating the cause node is stored in a cause node ID 400, the node ID indicating the effect node is stored in an effect node ID 401, and identification information (hereafter, referred to as link ID) indicating the link connecting the cause node and the effect node to each other are stored in a link ID 402.

Figure 5:
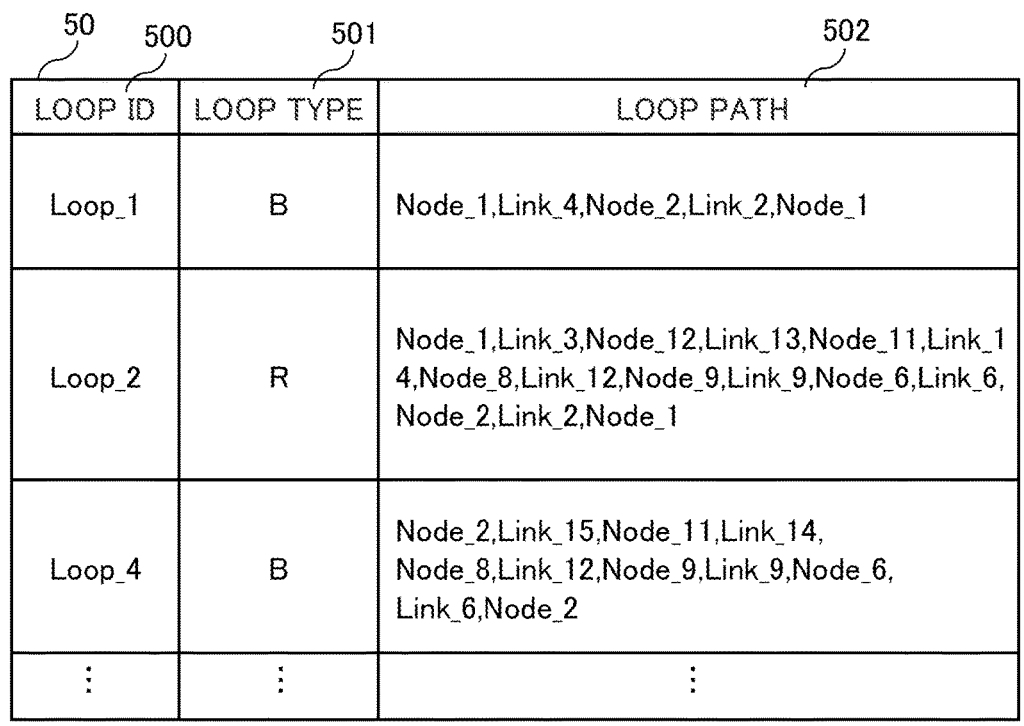
FIG. 5 is a view showing a configuration example of a loop structure data table.

The loop structure data table 50 stores information (hereafter, referred to as loop structure information) indicating a group of nodes and links forming a loop (hereafter, referred to as loop structure). FIG. 5 is a view showing a configuration example of the loop structure data table 50. The loop structure information stored in the loop structure data table 50 includes items of a loop ID 500, a loop type 501, and a loop path 502. The loop ID 500 is information for identifying the loop structure. The loop type 501 is information indicating whether the loop structure is the balancing loop or the reinforcing loop. In the embodiment, when the loop structure is the balancing loop, "B" is stored in the loop type 501. Meanwhile, when the loop structure is the reinforcing loop, "R" is stored in the loop type 501. The loop path 502 stores the node IDs and the link IDs of the group of nodes and links forming the loop which starts from one node and returns to this node.

The reference model data table 60 stores information (hereafter, referred to as reference model information) indicating the reference model. FIG. 6 is a view showing a configuration example of the reference model data table 60. The reference model information registered in the reference model data table 60 includes a model name item 600, a model drawing item 601, a contacting loops item 602, a contact node item 603, a link configuration of contact node item 604, a story of a problem likely to occur item 606.

The name of the system archetype is stored in the model name item 600. Data (hereafter, referred to as CLD data) indicating the loop structures in the reference model is stored in the model drawing item 601. This CLD data is, for example, image data such as PNG (Portable Network Graphics) and is used in a case of displaying an image on an area 902 of a matching result display screen 90, the area 902 configured to display the explanation of the matching reference model. When the reference model includes multiple loop structures, the contacting loops item 602 stores paired pieces of information (hereafter, referred to as loop information) indicating two loop structures in contact with each other. In the embodiment, the loop information is formed of the types of the loops and the numbers given to the loops without any overlaps for each of the types of loops in the system archetype. The type of loop is "B" when the loop is the balancing loop and is "R" when the loop is the reinforcing loop. In an example of "successes for the successful" in FIG. 6, two reinforcing loops are in contact with each other and a pair of "R1, R2" is stored in the contacting loops item 602, where one of the reinforcing loops is "R1" and the other one of the reinforcing loops is "R2". The contact node item 603 stores information indicating a node (hereafter, referred to as contact node) which is a contact point between the two loops in contact with each other. The link configuration of contact node 604 stores, for each of the contact nodes shown in the contact node item 603, a configuration of an arrow coming into the node and a configuration of an arrow going out from the node. The configurations of the arrows are expressed by "Rout", "Rin", "Bout", "Bin", "RBout", "RBin", "RRout", "RRin", "BBout", and "BBin". An arrow going out from the contact node to the "R" loop is expressed by "Rout", an arrow coming into the contact node from the "R" loop is expressed by "Rin", an arrow going out from the contact node to the "B" loop is expressed by "Bout", and an arrow coming into the contact node from the "B" loop is expressed by "Bin". In a case where one arrow belongs to both of the "R" loop and the "B" loop, an arrow going out from the contact node to the "R" loop and the "B" loop is expressed by "RBout", and an arrow coming into the contact node from the "R" loop and the "B" loop is expressed by "RBin". In a case where one arrow belongs to two different "R" loops, arrows are expressed by "RRout" and "RRin" based on a similar idea. In a case where one arrow belongs to two different "B" loops, arrows are similarly expressed by "BBout" and "BBin". In the example of "success for the successful" in FIG. 6, the contact node is a "distribute not to B but to A" node (n1), and there are one arrow going out from the contact node to R1 which is one of the loops in contact with each other at the contact node and one arrow coming into the contact node from R1. Moreover, there are one arrow going out from the contact node to R2 and one arrow coming into the contact node from R2. Accordingly, "{Rout, Rin, Rout, Rin}" is stored in the link configuration of contact node 604, and explanation of a problem likely to occur in this system archetype is stored in the story of a problem likely to occur 606.

The matching data table 1000 is a table used for the pattern matching between the loop structure and the reference model. FIG. 7 is a drawing showing a configuration example of the matching data table 1000. The name (model name 600 of the reference model information) of the reference model used in the pattern matching is put into a model name 10000. The loop ID of the loop forming the loop structure is put into a loop ID 10003. The loop structure is sometimes formed of a combination of multiple loops, and in such a case, multiple loop IDs are registered in the loop ID 10003. The pattern ID 10001 is information (hereafter, referred to as pattern ID) for identifying the combination of the loop IDs registered in the loop ID 10003 (it is assumed that a combination is formed even when only one loop ID is registered in the loop ID 10003). A node number 10004 is the number of nodes included in the combination (loop structure) of the loops shown by the loop IDs registered in the loop ID 10003. Note that, in a case where there is a portion common to the multiple loops shown by the loop IDs, the number of nodes included in the common portion is not counted in the node number 10004. A delay link number 10005 is the number of delay links included in the loop structure. A match flag 10006 is information indicating whether the loop structure matches the reference model. As will be described later, the match flag 10006 is updated according to an input from a user.

Figure 8:
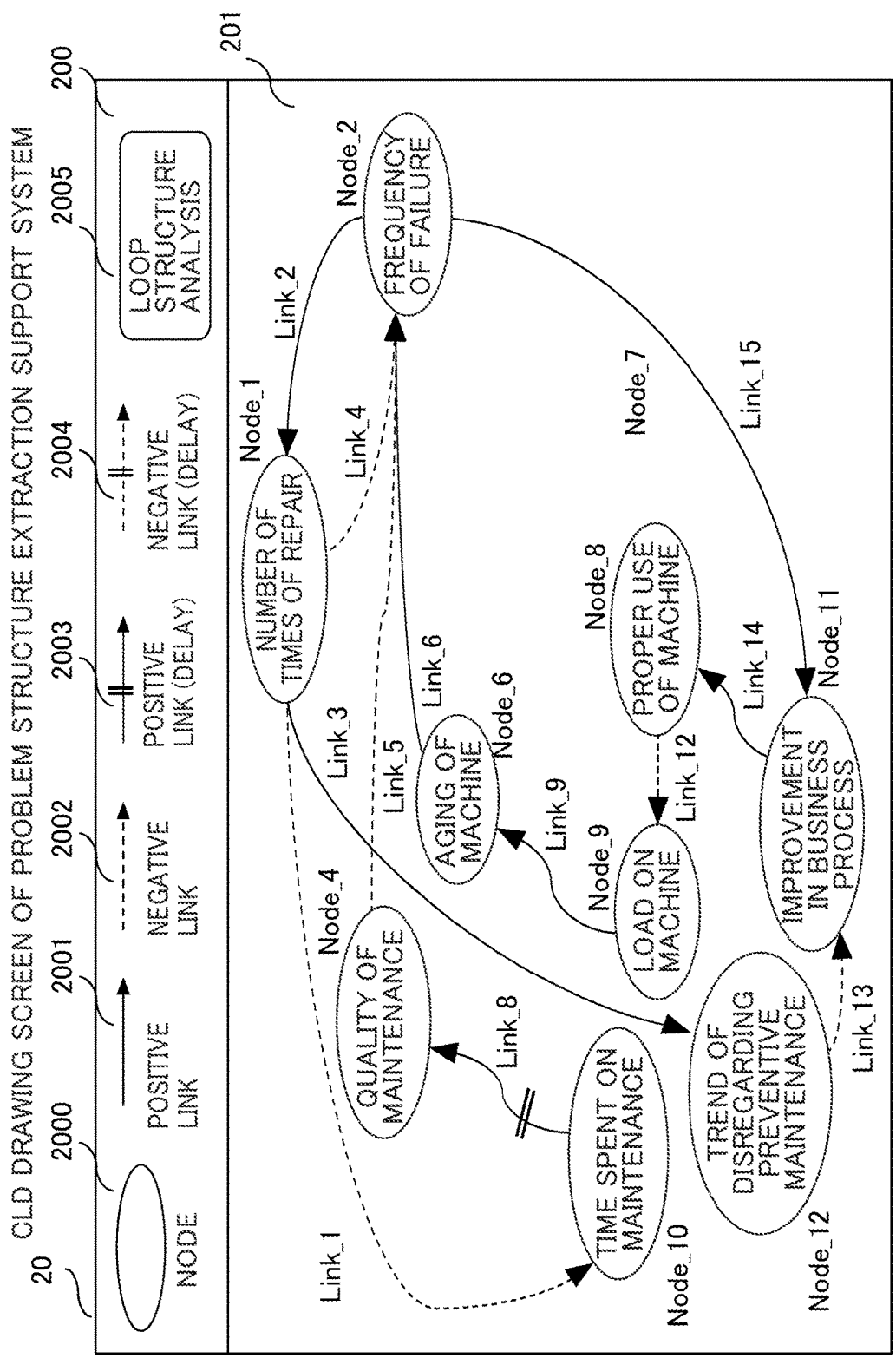
FIG. 8 is a view showing an example of a CLD drawing screen.

FIG. 8 is a view showing an example of a CLD drawing screen 20 which is an interface used to draw the CLD of the problem structure extraction support system. The CLD drawing screen 20 includes a tool group area 200 and a drawing area 201. The tool group area 200 includes objects used to draw the nodes and the links and specifically includes a node object 2000, a positive correlation link object 2001, a negative correlation link object 2002, a positive correlation link (delay) object 2003, a negative correlation link (delay) object 2004, and a loop structure analysis button 2005 for extracting the loop structure from the drawn CLD and perform matching between the extracted loop structure and the structure of the reference model. In the embodiment, a node is shown by an ellipse but another figure may be used instead. Moreover, regarding the links, the positive correlation link is shown by a solid-line arrow, the negative correlation link is shown by a broken-line arrow, the positive correlation link (delay) is shown by a solid-line arrow with two vertical lines, and the negative correlation link (delay) is shown by a broken-line arrow with two vertical lines. However, arrows other than these arrows may be used instead as long as the four types of links can be distinguished from one another. When these objects are selected by being dragged and dropped with a mouse, by being clicked with a mouse, or by being subjected to a similar operation, the selected objects are drawn in the drawing area 201. Regarding the nodes, the name of the nodes can be written after the nodes are drawn in the drawing area 201. By using these nodes and links, the system which is a target of the problem structure extraction is modeled with the CLD and the evaluation model is thereby created. Note that a publicly-known technique is used for processing of modeling the system with the CLD such as receiving specification of an object in the CLD drawing screen 20, arranging the specified object in the drawing area 201, coupling two nodes to each other by a link, and receiving an input of the name of a node and writing the name in an object of the node, and description of the processing is omitted herein.

Figure 9:
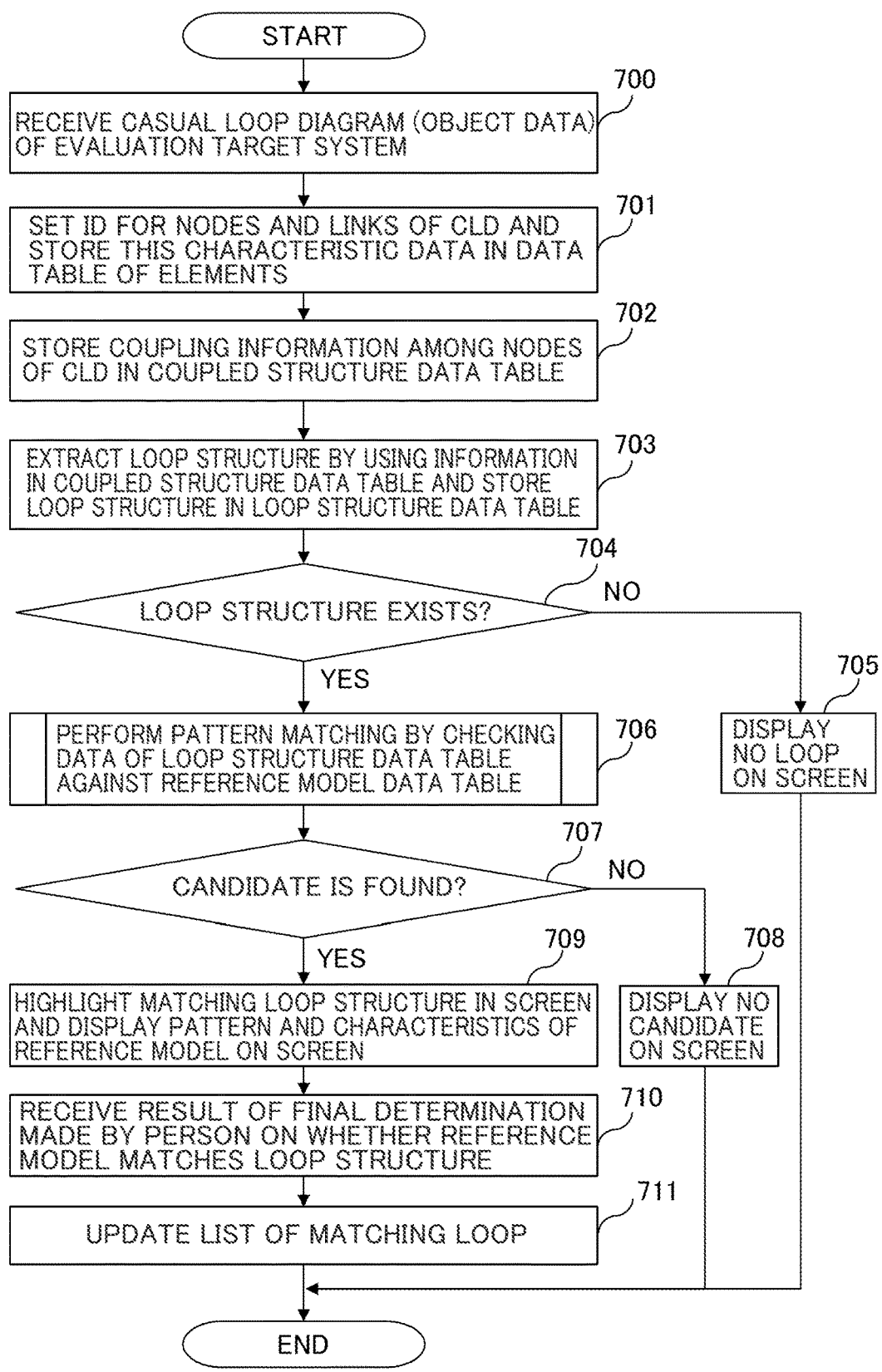
FIG. 9 is a flowchart showing a flow of processing in the problem structure extraction support system.
Figure 10:
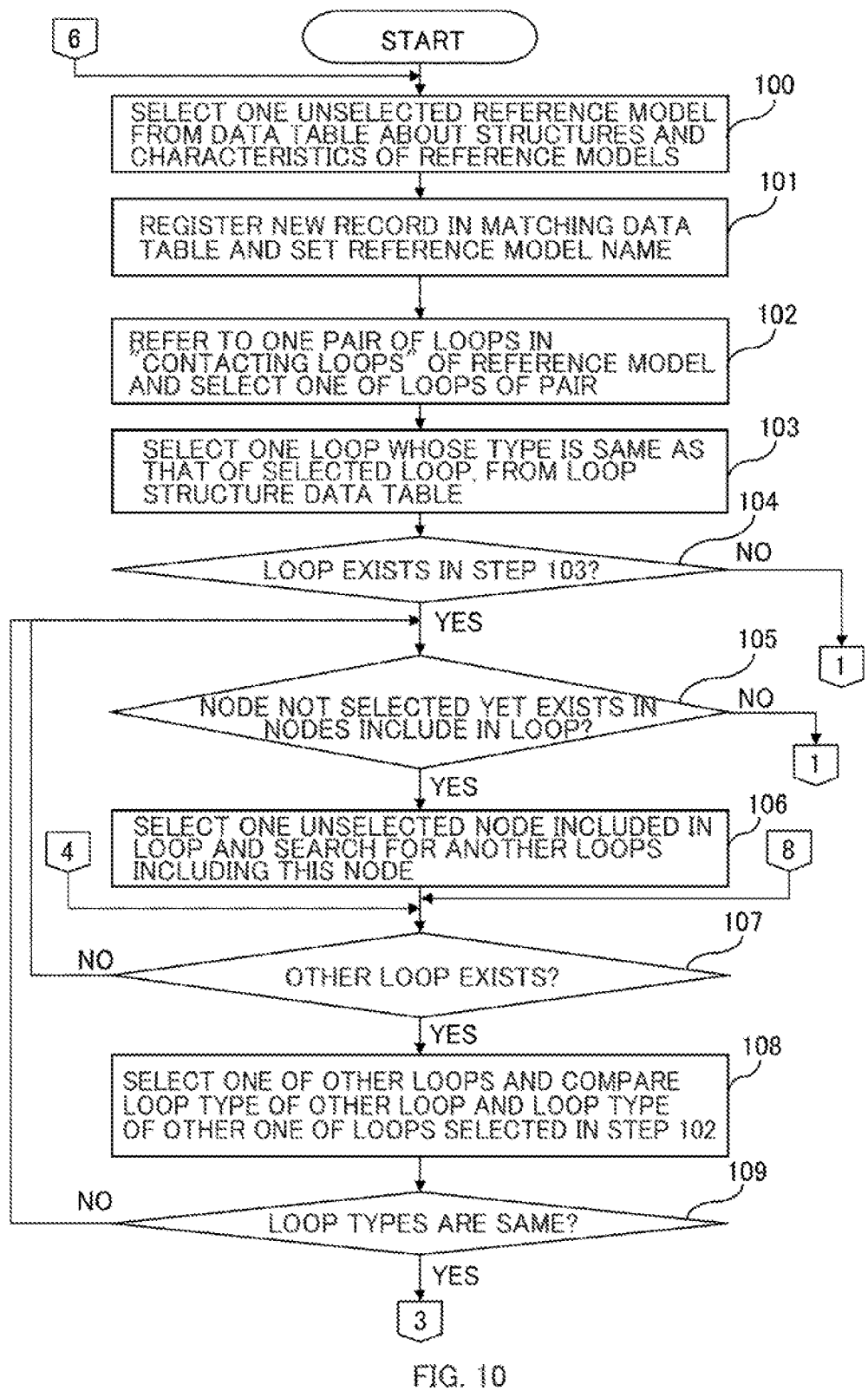
FIG. 10 is a flowchart showing a flow of processing of pattern matching with a reference model.
Figure 11:
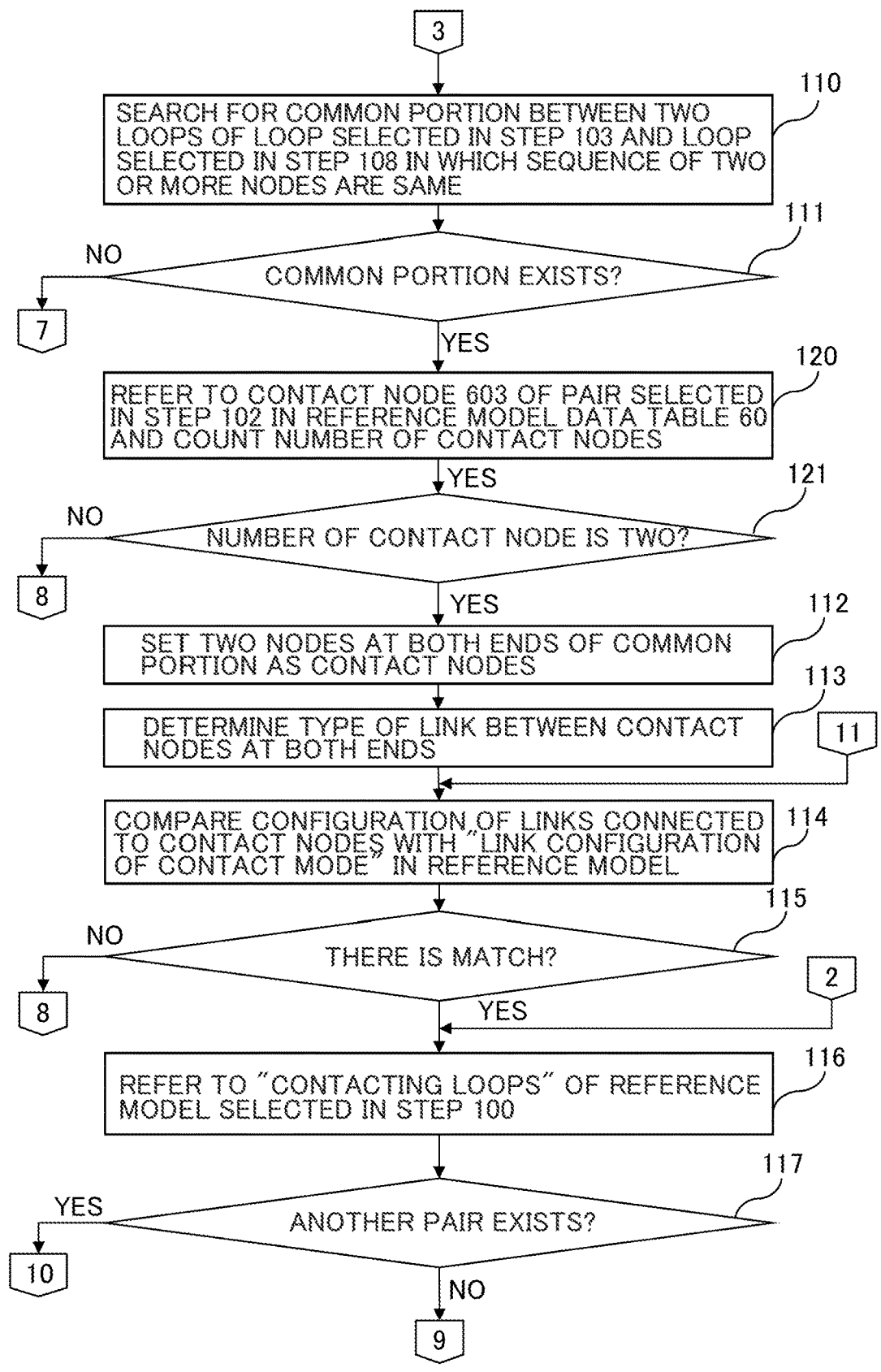
FIG. 11 is a flowchart showing the flow of processing of pattern matching with a reference model.
Figure 12:
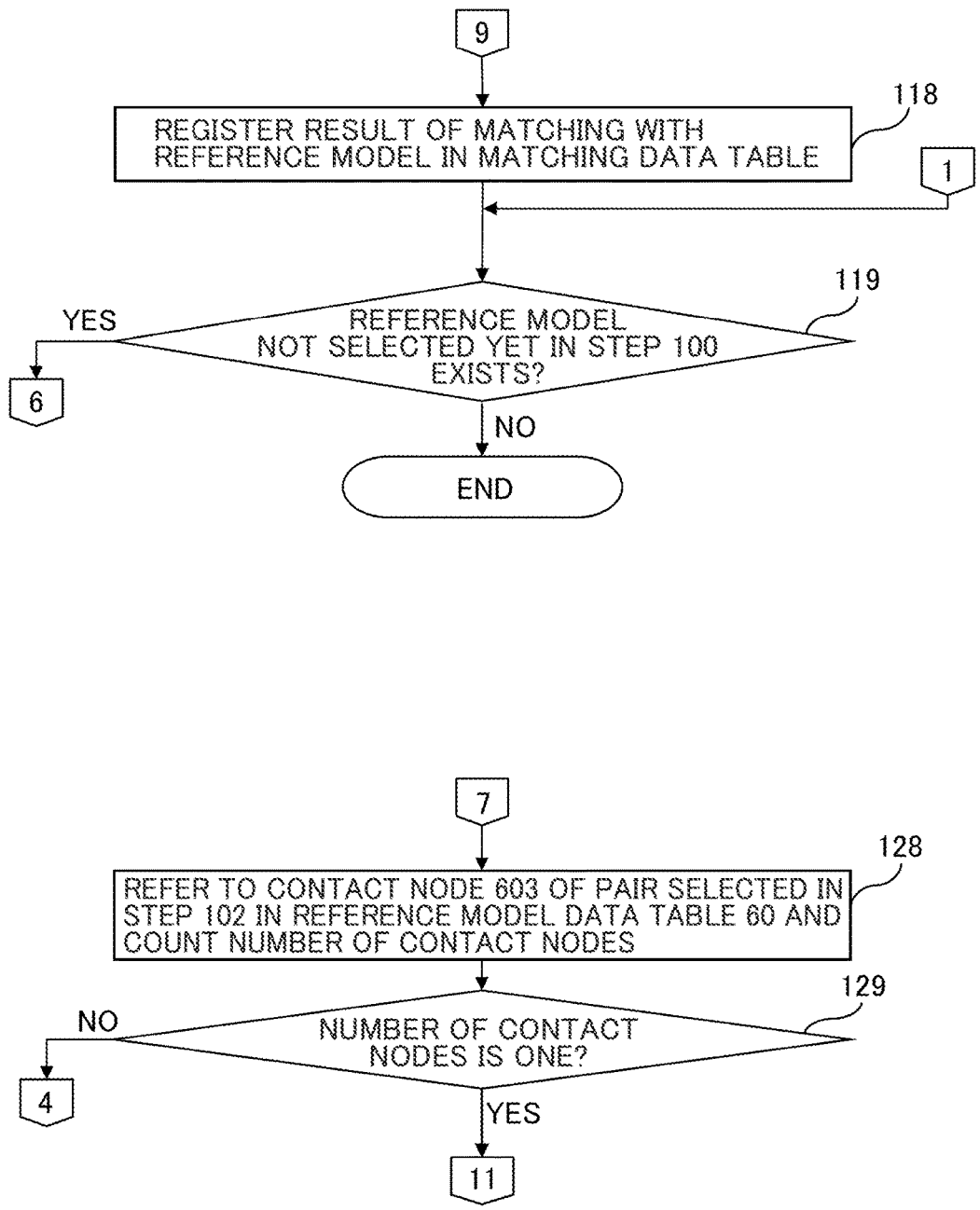
FIG. 12 is a flowchart showing the flow of processing of pattern matching with a reference model.
Figure 13:
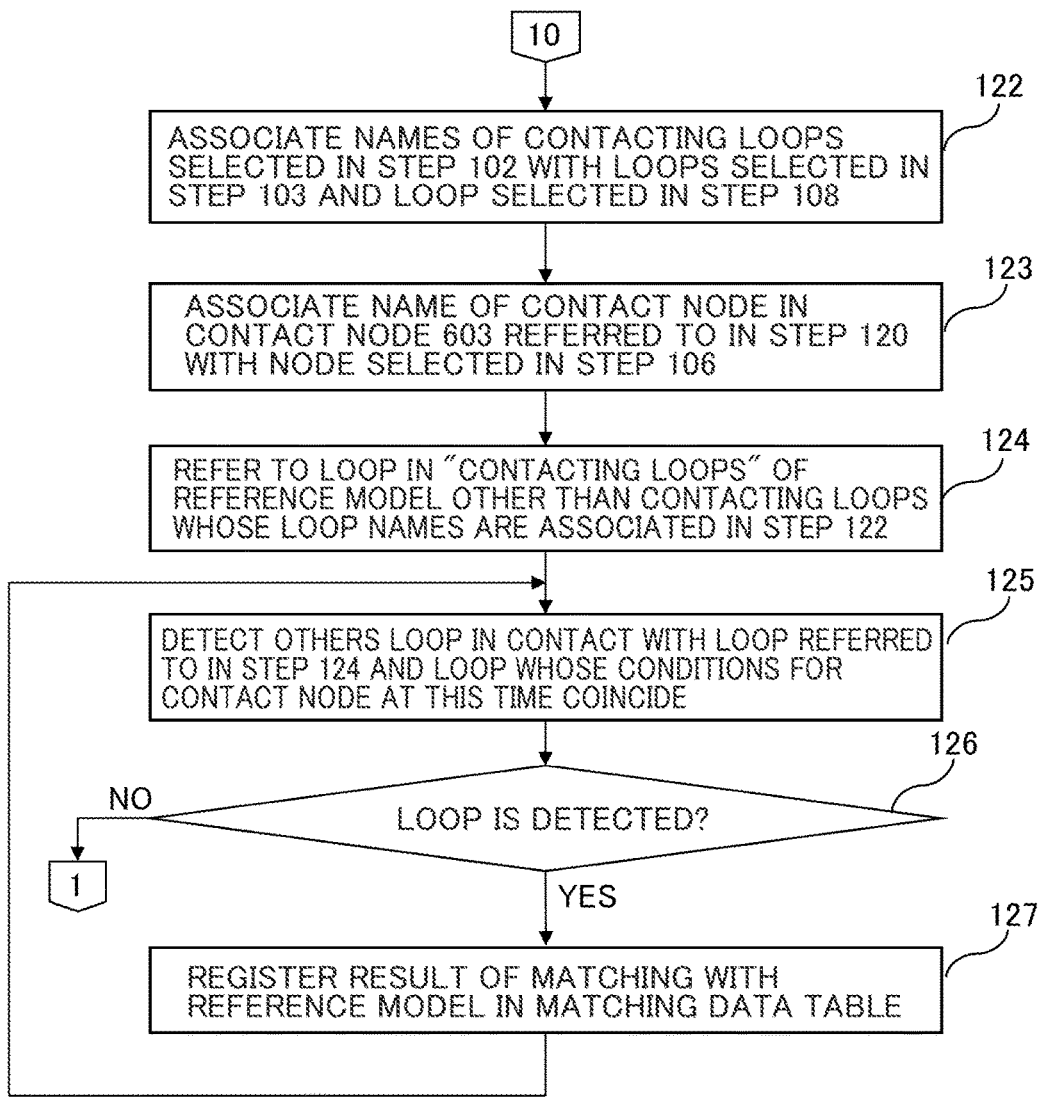
FIG. 13 is a flowchart showing the flow of processing of pattern matching with a reference model.

FIG. 9 is a processing flow of the problem structure extraction support system. In step 700, the evaluation model input part 21 receives input of object data of an evaluation target system drawn by using the CLD drawing screen 20. Note that the object data is assumed to include the shapes and names of the objects representing nodes and links as well as coupling relationships among the nodes and links. The evaluation model input part 21 may accept the input of the object data every time an object is drawn in the CLD drawing screen 20 or accept the input of the object data when the loop structure analysis button 2005 is pushed. In step 701, the evaluation model input part 21 analyzes the structure of the CLD drawn in the drawing area 201. Specifically, the evaluation model input part 21 assigns an ID to each of the nodes and links (i.e. elements of the CLD)

included in the object data and obtains element information about each of the elements. Specifically, the evaluation model input part 21 obtains the name for each of the nodes and obtains the type and the presence or absence of delay for each of the links from the shape of the link. For example, the evaluation model input part 21 can detect an elliptical object as a node and obtain the name set in the elliptical object as the name of the node. Moreover, the evaluation model input part 21 can detect an arrow-shaped object as a link and determine the type (positive correlation link or negative correlation link) of the link based on whether the arrow is a solid line and also determine whether the link has a delay based on whether the two vertical lines are added to the arrow. The evaluation model input part 21 stores the detected element information about each of the elements in the CLD element data table 30 while associating the element information with the assigned ID. The timing at which the IDs are assigned and the element information is stored in the element data table 30 may not be the time at which the loop structure analysis button 2005 is pushed. Instead, the element information may be stored while the CLD is being drawn in the CLD drawing screen 20.

In step 702, the coupled structure extraction part 22 analyzes the object data and stores the coupled structure information in the coupled structure data table 40.

In step 703, the loop structure extraction part 23 searches for the loop structure included in the CLD based on the coupled structure information. When the loop structure is found, the loop structure extraction part 23 stores the loop structure information indicating the loop structure in the loop structure data table 50. The loop structure extraction part 23 can extract a structure which starts from one cause node and returns to the same node by following links, as the loop structure. For example, the loop structure extraction part 23 can extract the loop structure by setting one node as a start node and setting this start node as X, then setting the effect node ID 401 in the coupled structure information whose cause node ID 400 is X as new X, and sequentially searching the coupled structure data table 40 in this way until X coincides with the start node or there is no cause node ID 400 which is X. When no loop structure is extracted, the loop structure extraction part 23 may display a message notifying that no loop exists, on the interface of the problem structure extraction support system. When the loop structure is extracted, the loop structure extraction part 23 creates the loop structure information, assigns the loop ID to the loop structure, and stores the loop ID in the loop ID 500 of the loop structure information. Moreover, the loop structure extraction part 23 stores "B" in the loop type 501 of the loop structure information when the loop structure is the balancing loop and stores "R" in the loop type 501 when the loop structure is the reinforcing loop. The loop structure extraction part 23 stores a set of node IDs and link IDs arranged in the order in which the nodes and the links are followed in the loop structure, as a path of this loop in the loop path 502 of the loop structure information. The loop structure extraction part 23 stores the loop structure information in which the loop ID 500, the loop type 501, and the loop path 502 are set as described above, in the loop structure data table 50.

In step 704, the problem structure extraction support system determines whether the loop structure is extracted in step 703. When no loop is extracted, the processing proceeds to step 705 and the loop structure extraction part 23 displays that no loop structure is extracted and terminates the processing. When the problem structure extraction support system determines that the loop structure is extracted in the determination of step 704, the processing proceeds to step 706 and pattern matching between the loop structure and the structure of the reference model which is shown in FIGS. 10 to 13 is performed.

FIGS. 10 to 13 are flowcharts showing the flow of processing of the pattern matching with the reference model.

In step 100, the matching processing part 24 selects one of pieces of reference model information stored in the reference model data table 60. In a case where another reference model is selected in the second pattern matching or after that, the matching processing part 24 resets the history of selected nodes and loops.

In step 101, the matching processing part 24 creates a new record of the matching data table 1000 and sets the model name 10000 to the model name of the reference model selected in step 100.

In step 102, the matching processing part 24 refers to one pair of loops in the contacting loops item 602 of the reference model information selected in step 100 and selects one of the loops of the referred pair. For example, in a case where the reference model information whose model name item 600 is "shifting the burden" is selected in step 100, you can refer to the contacting loops item 602 of this reference model information and see that there are a combination of "B1 and B2" and a combination of "B2 and R1". For example, when the matching processing part 24 refers to the combination of "B1 and B2" out of these combinations, one of two loops of "B1" and "B2", for example, "B1" can be selected.

In step 103, the matching processing part 24 detects loop structure information whose loop type 501 is the same as the type of the loop selected in step 102, from the loop structure data table 50. When B1 is selected in step 102, the matching processing part 24 searches for the loop structure information whose loop type 501 is "B". In the example of FIG. 5, the matching processing part 24 can select the loop structure information whose loop ID 500 is "Loop_1".

In step 104, the matching processing part 24 determines whether the loop structure information is detected in step 103. When the loop structure information is detected (step 104: Yes), the processing proceeds to step 105. When no loop structure information is detected (step 104: No), the processing proceeds to step 119.

In step 105, the matching processing part 24 refers to the loop path 502 of the loop structure information detected in step 103 and checks whether there is a node not selected yet in the nodes included in the loop path 502. In a case where there is no unselected node (step 105: No), the processing proceeds to step 119. When there is one or more unselected nodes (step 105: Yes), the matching processing part 24 selects one of such nodes in step 106. In the example of FIG. 5, when the loop structure information whose loop ID 500 is "Loop_1" is selected in step 103, "Node_2" included in the loop path 502 can be selected. Moreover, the matching processing part 24 searches the loop structure data table for the loop structure information other than the loop structure information selected in step 103 which includes the selected node in the loop path 502. In a case where there is no such other loop structure information (step 107: No), the processing returns to step 105. In a case where there is such other loop structure information (step 107: Yes), the processing proceeds to step 108.

In step 108, the matching processing part 24 selects one of pieces of the aforementioned other loop structure information and compares the loop type 501 of the other loop structure information with the type of the other loop in the pair of loops selected in step 102. When "Node_2" is selected in step 106, the matching processing part 24 selects the loop structure information whose loop ID 500 is "Loop_4", the loop structure information including "Node_2" in the loop path 502. The loop type 501 of the selected loop structure information is "B". When "B1" is selected from the combination of "B1 and B2" in step 103, the loop type of the other loop "B2" is "B". Then, the matching processing part 24 compares the loop type 501 "B" of the selected loop structure information and the loop type "B" of the other loop with each other.

When the loop types are different from each other (step 109: No), the processing returns to step 105. When the loop types are the same (step 109: Yes), the processing proceeds to step 110.

In step 110, the matching processing part 24 compares two loops shown by the loop structure information selected in step 103 and the other loop structure information selected in step 108, based on the loop structure information and the other loop structure information, and determines whether there is a portion where a sequence of multiple nodes are the same, i.e. a portion (common portion) where paths are common between the two loops. When there is no such common portion (step 111: No), the processing proceeds to step 122. In this case, the number of contact points between the two loops is one, and the node selected step 106 is the contact node. When there is a common portion (step 111: Yes), the processing proceeds to step 128.

In step 120, the matching processing part 24 refers to the contact node 603 of the pair selected in step 102 in the reference model data table 60 and counts the number of contact nodes. For example, when the pair of "B1" and "B2" in "shifting the burden" is selected in step 102, "n1" is the only contact node, and the number of contact nodes is one. Meanwhile, when the pair of "B2" and "R1" is selected, there are contact nodes "n1" and "n2", and the number of contact nodes is two.

In step 121, when the number of contact nodes counted in step 120 is two, the processing proceeds to step 112. When the number of contact nodes is not two, the loop structure obtained by combining the loop selected in step 103 and the loop selected in step 108 do not match the pair in the reference model selected in step 102. The processing thus returns to step 107 to search again for other loops including the node selected in step 106.

In step 112, the matching processing part 24 rounds the nodes of the common portion to nodes at both ends, i.e. the first node and the last node, and sets these two nodes at both ends as the contact nodes.

In step 113, the matching processing part 24 changes the type of the link between the contact nodes. When multiple nodes are replaced by one node, the links coupling these multiple nodes are also deleted. Accordingly, there is a case where a relationship (positive correlation or negative correlation) between each of the contact nodes after the replacement and another node coupled to the contact node via the link should be changed. The matching processing part 24 thus sets the type of the link coupling the contact nodes after the replacement according to the number of deleted links of each type. FIG. 14 is a view for explaining processing of changing the type of the link coupled to each of the contact nodes. In a view on the left side of FIG. 14 which shows part of the CLD, two loops have a common portion 80 including nodes b, c, d, and e. Nodes at both ends among the nodes in the common portion 80 are left, and other nodes in the common portion 80 are deleted. An upper part of FIG. 14 shows, as an example, a case where a node b and a node e which are nodes at both ends of the common portion 80 are left and the other nodes c and d are deleted. First, the matching processing part 24 extracts, from the element data table 30, link types 3020 corresponding to the link IDs indicating the links included in the common portion 80. In the example of the upper part of FIG. 14, the links included in the common portion are link 5 (804), link 6 (805), and link 7 (806). The link type of the link 5 (804) and the link 7 (806) is "−1" indicating negative correlation, while the link type of the link 6 (805) is "1" indicating positive correlation. Upon replacement of the common portion 80 by the nodes b and e, the type of the link between the node b and the node e is changed as shown in common portion 81. The type of a link 8 (810) between the nodes b and e is calculated by multiplying together the values assigned to the types of the links following the node b until reaching the node e. Specifically, $(-1) \times 1 \times (-1) = 1$, and the link 8 (810) is the positive correlation link.

In the present invention, the nodes in the common portions are rounded to the nodes at both ends of the common portion to perform mapping with the reference model. This method of calculating the type of link can be applied to round the common portion to one or two nodes which are not necessarily nodes at both ends in a case of, for example, displaying the CLD in a simplified manner. The example of the lower part of FIG. 14 is an example showing a case where the node c and the node d in the common portion 80 are left and the other nodes b and e are deleted. The matching processing part 24 extracts, from the element data table 30, the link types 3020 corresponding to the link IDs of the links coming into the common portion 80. The links coming into the common portion 80 are a link 1 (800) and a link 3 (802). The link type of the link 1 (800) is "1" indicating the positive correlation while the link type of the link 3 (802) is "−1" indicating the negative correlation. The matching processing part 24 checks the link types of the links going out from the common portion 80 in a similar way. In a case of replacing the common portion 80 by the nodes c and d, the matching processing part 24 changes the link types of the link coming into the node c, the links 1 to 4 going out from the node d, and the link between the nodes c and d. The type of link 1 (800) is calculated by multiplying together the value ("1" in the example of FIG. 14) indicating the type of the link 1 (800) and the value ("−1" in the example of FIG. 14) indicating the type of the link (only the link 804 in the example of FIG. 14) before the node c which is the first node to be left in a common portion 82. Specifically, $1 \times (-1) = -1$, and the link 1 (800) is the negative correlation link. The type of link 2 (801) is calculated by multiplying together the value ("−1" in the example of FIG. 14) indicating the type of the link (link 806 in the example of FIG. 14) after the node d in the common portion 80 and the value ("−1" in the example of FIG. 14) indicating the type of the link 2 (801). Specifically, $(-1) \times (-1) = 1$, and the link 2 (801) is the positive correlation link. The link types of the links 3 (802) and the link 4 (803) can be determined in a similar way. Specifically, since "−1" indicating the type of link 3 (802)דー1" indicating the type of the link 804="1", the type of link 3 (802) is the positive correlation link. Moreover, since "−1" indicating the type of link 806ד"1" indicating the type of the link 4 (803)="−1", the type of link 4 (803) is the negative correlation link. The type of the link between the nodes c and d is obtained by multiplying together the values assigned to the types of the links following the node b until reaching the node e. In the example of FIG. 14, since the link 805 is the only such link, the obtained value is "1" and the link type of link 9 (820) is the positive correlation link. The diagram shown on the right side of the lower part of FIG. 14 is a diagram in which the common portion 80 is replaced by the nodes c and d.

Returning to FIG. 11, in the next step 114, the matching processing part 24 compares the reference model and the loop structure obtained by combining the loop selected in step 103 and the loop selected in step 108. In the embodiment, the matching processing part 24 performs comparison to determine whether the characteristic of the contact node and the characteristic of the contact node in the reference model coincide with each other. Specifically, the matching processing part 24 detects the configuration of the links coming into and going out from the contact node and performs comparison to determine whether the detected configuration coincides with the link configuration of contact node 604 corresponding to the pair of loops selected from the contacting loops 602 in step 102. For example, when the pair of "B2" and "R1" of "shifting the burden" is selected in step 102, the matching processing part 24 performs comparison to determine whether the configuration of the links connected to the two nodes set as the contact nodes in step 112 coincides with the combination in the link configuration of contact nodes 604, i.e. coincides with the combination of {Bout, RBin, Rout} and {RBout, Bin, Rin}. When the configuration coincides (step 115: Yes), the processing proceeds to step 116. When the configuration does not coincide (step 115: No), the processing returns to step 107.

In step 116, the matching processing part 24 refers to the contacting loops 602 in the reference model information corresponding to the reference model selected in step 100. The matching processing part 24 refers to the contacting loops 602 again because there may be a reference model including three or more loops.

In step 117, the matching processing part 24 determines whether there is a pair in the contacting loops 602 not selected yet in step 102. When there is a pair not selected yet (step 117: Yes), the processing proceeds to step 122. When there is no such pair (step 117: No), the processing proceeds to step 118. In the example of FIG. 6, when the pair of "B2 and R1" is selected from the contacting loops 602 in the reference model information whose model name 600 is "shifting the burden" as described above, the processing proceeds to step 122 because there are the combination of "B1 and B2" and the combination of "B1 and R1". In steps 122 and steps thereafter, when a reference model including three or more loops is selected, a loop satisfying conditions of the third loop is detected. The conditions are another loop in contact and the contact node with the other loop.

In step 122 and step 123, the names of the contacting loops selected in step 102 and the name of the contact node of this pair of loops are associated with the loops selected in step 103 and the loop selected in step 108. For example, when the pair of "B2 and R1" in "shifting the burden" is selected in step 102 and "Loop_2" and "Loop_4" are selected in step 103 and step 108, "Loop_2" is associated with "R1", "Loop_4" is associated with "B2", "Node_2" is associated with "n1", and "Node_11" is associated with "n2".

In step 124, the matching processing part 24 refers to a loop in the "contacting loops" of the reference model, the loop being a loop other than the contacting loops whose loop names are associated in step 122. In the example described above, "B1" corresponds to such a loop.

In step 125, the matching processing part 24 detects other loops in contact with the loop referred to in step 124 and detects a loop whose conditions for the contact node at this time coincide. In this example, "B1" and "B2" are loops which are in contact with each other only at "n1" and which are in contact with "R1" at "n2" and "n3". Specifically, the matching processing part 24 detects a loop which only has "Node_2" as the common node with "Loop_4" and which has two nodes of "Node_2" and a node other than the "Node_2" and "Node_11" as common nodes with "Loop_2". When such a loop is detected, (step 126: Yes), the processing proceeds to step 127. When no such loop is detected (step 126: No), processing proceeds to step 119.

In step 127, the matching processing part 24 registers a result of the matching in the matching data table 1000. Since this step is similar to step 118, details are to be described in the explanation of step 118. Then, the processing returns to step 125 again.

Returning to step 111, when the two loops of the loop selected in step 103 and the loop selected in step 108 do not have a common portion in which a sequence of two or more nodes are the same, the node selected in step 106 is set as the contact node. In step 128, the matching processing part 24 refers to the contact node 603 of the pair selected in step 102 and counts the number of contact nodes. When the number of contact nodes is one as a result of referring to the contact node 603 (step 129: Yes), the processing proceeds to step 114. When the number of contact nodes is not one. i.e. two (step 129: No), the combination of the loop selected in step 103 and the loop selected in step 108 does not agree with the conditions of the pair selected in step 102. Accordingly, the processing returns to step 107, and the matching processing part 24 searches for a new loop.

In step 118, the matching processing part 24 registers the result of matching in the matching data table 1000. Specifically, the matching processing part 24 sets the loop ID 10003 to the loop ID 500 of the loop structure information selected in step 103, assigns a pattern ID to the combination of loop IDs set in the loop ID 10003, and sets the pattern ID 10001 to the assigned pattern ID. The matching processing part 24 counts the numbers of nodes and delay links included in the combination of the loops in which the common portion is replaced by one node, and sets the node number 10004 and the delay link number 10005 to the counted numbers. The matching processing part 24 leaves the match flag empty. Note that, when the matching between the reference model and the loops structure obtained by combining the loop selected in step 103 and the loop selected in step 108 fails in step 114, the matching processing part 24 leaves the pattern ID 10001, the loop ID 10003, the node number 10004, and the delay link number 10005 empty.

In step 119, the matching processing part 24 checks whether there is a reference model not selected yet in step 100. When there is a reference model not selected yet, processing returns to step 100. When there is no such reference model, the processing is terminated.

Returning to FIG. 9, when no reference model which is a candidate is found in the matching of step 706 (step 707: No), the processing proceeds to step 708. In step 708, the matching processing part 24 displays the fact that no candidate is found on the matching result display screen 90 to be described later.

When the reference model which is a candidate is found in step 706, the processing proceeds to step 709. In step 709, a matching loop structure is highlighted in the matching result display screen 90 to be described later and the model name and characteristics of the reference model are displayed on the matching result display screen 90. The matching result display screen 90 includes a button for inputting a result of final determination by a person on whether the reference model matches the loop structure and a button for selecting a correct model name when the reference model does not match the loop structure. In step 710, the matching processing part 24 receives the result of determination on whether the reference model matches the loop structure through the button. In step 711, the matching processing part 24 updates the match flag 10006 and the model name 10000 of the matching data table 1000 according to the received result.

Figure 15:
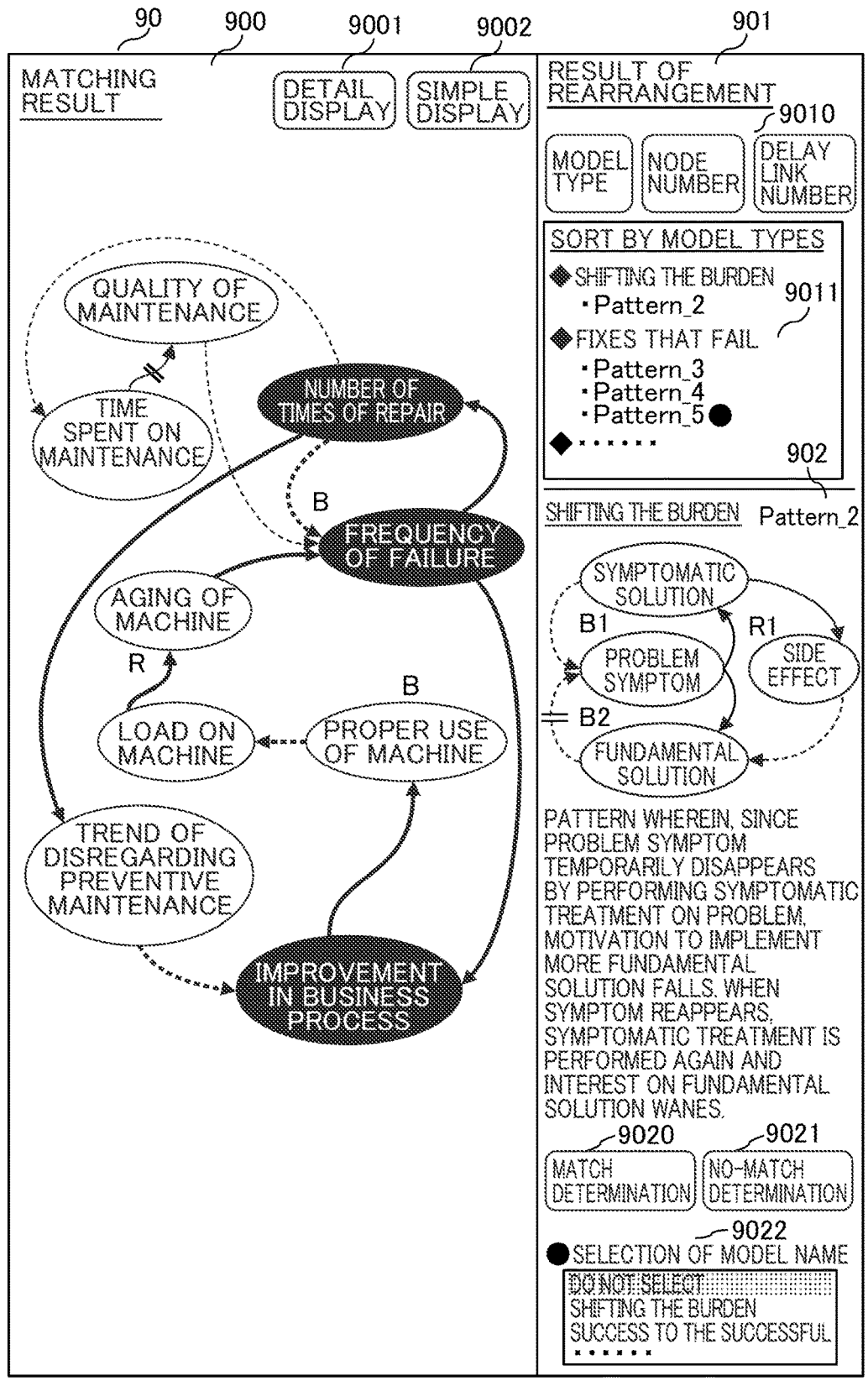
FIG. 15 is a view showing an example of a matching result display screen.

FIG. 15 is a view showing an example of the matching result display screen 90. The matching result display screen 90 includes an area 900 for displaying the matching result on the CLD, an area 901 for displaying a list of successfully-matching loops, and an area 902 for displaying an explanation of the matching reference model. The area 901 for displaying the list of matching loops includes condition buttons 9010 which enable rearrangement of results based on various conditions. The results rearranged by using the condition buttons 9010 are displayed in a result list display area 9011. When a pattern ID displayed in the result list display area 9011 is selected by a mouse click or the like, an explanation of a reference model matching the selected pattern ID is displayed in the area 902 for displaying the explanation of the reference model. Moreover, a corresponding loop on the CLD drawn in the area 900 for displaying the matching result on the CLD is highlighted. Furthermore, the contact node may also be highlighted to show the structures of the loops more clearly. The area 900 for displaying the matching result on the CLD includes buttons for switching the granularity of the display of the CLD. When a detail display button 9001 is pushed, the CLD drawn in the CLD drawing screen 20 is displayed. Meanwhile, when a simple display button 9002 is pushed, a simple diagram of the CLD in which nodes are rounded in the method shown in the lower part of FIG. 14 is displayed for the CLD corresponding to the pattern ID selected in the result list display area 9011.

The matching result display screen 90 includes the display condition buttons 9010 for changing the display conditions. In the example of FIG. 15, a model type button, a node number button, and a delay link number button are displayed as the display condition buttons 9010. When the model type button is pushed, the results are sorted by the model types of reference models and displayed. When the node number button is pushed, the results are rearranged in the ascending or descending order of the number of nodes included in the matching loop structure. When the delay link number button is pushed, the results are rearranged in the ascending or descending order of the number of delay links included in the matching loop structure. Note that information displayed in the area 901 for displaying the list of the matching loops and the area 902 for displaying the explanation of the matching reference model can be obtained from the reference model data table 60 and the matching data table 1000. When the model type button is pushed, the match flag 10006 in the matching data table 1000 is referred to and only the loop structure whose match flag 10006 is 1 or empty is displayed. Moreover, when the numerical value of the match flag 10006 is 1, the pattern ID 10001 corresponding to this match flag 10006 is provided with a mark or the like in a case of displaying the pattern ID 10001 in the result list display area 9011 to show that the loop structure is determined to match the reference model. In the example of FIG. 15, a mark of a black circle beside the pattern ID 10001 shows that the match flag 10006 is set to "1". Changing the way of displaying the result list as described above supports determination of matching by a person.

A person determines whether each of the loop structures displayed in the list as matching candidates really matches the reference model while referring to the explanation of the reference model displayed in the area 902 for displaying the explanation of the reference model, and pushes a match determination button 9020 or a no-match determination button 9021. Moreover, there is a model name selection button 9022 for selecting a model name, and a person can select a correct model name when determining that there is no match. The matching processing part 24 updates the match flag 10006 of the matching data table 1000 to "1" when the match determination button 9020 is pushed and updates the match flag 10006 of the matching data table 1000 to "0" when the no-match determination button 9021 is pushed. Moreover, when a model name is selected from the model name selection button 9022, the name in the model name 10000 of the matching data table 1000 is changed to the selected name.

As described above, in the problem structure extraction support system of the embodiment, the candidates for structures which may include problem structures can be effectively listed by: extracting the loop structures from a sample model obtained by modeling an analysis target system with a CLD; and matching the extracted loop structures with the reference models.

Moreover, in the problem structure extraction support system of the embodiment, since the common portion where multiple loops overlap each other can be replaced by one contact node in the matching, it is possible to perform matching between the reference model and the loop structure including redundant nodes in the contact nodes. Accordingly, in the problem structure extraction support system of the embodiment, more loop structures having the possibility of including problems can be extracted than a case where the common portion is not replaced.

Moreover, in the problem structure extraction support system of the embodiment, the type of link coupled to the contact node can be changed depending on the type of link replaced in the common portion. In a case where multiple nodes are replaced by two nodes, since the links coupling the multiple nodes are deleted, the relationship of positive correlation or negative correlation between each of the replaced contact nodes and another node coupled to the contact node by a link sometimes should be changed. In the problem structure extraction support system of the embodiment, the direction of the link coupled to each contact node can be determined according to the number of directions of links deleted in the common portion. Accordingly, it is possible to correctly set the direction (type) of the link and prevent the characteristic of the evaluation model from being changed after the common portion is replaced by the contact nodes. At the same time, matching with more reference models can be performed. More loop structures having the possibility of including problems can be thereby extracted.

Furthermore, in the problem structure extraction support system of the embodiment, it is possible to display the successfully-matching loops and the evaluation model in the matching result display screen 90 and allow a user to make a final determination on whether each of the loops extracted from the evaluation model matches the reference model while visibly checking the loop and the evaluation model. The evaluation model can be thereby more surely evaluated.

In the embodiment, the system archetypes which are patterns of problems are used as the reference models. However, the present invention is not limited to this, and patterns other than the system archetypes may be used.

Moreover, the present invention can be applied to processing of extracting advantages of a system by registering successful patterns as the reference models.

What is claimed is:

1. A data retrieval system that improves performance of retrieving of an enhanced causal loop diagram (CLD), the system comprising:
a memory;
a storage device that stores a plurality of reference models;
a display; and
a processor communicatively coupled to the memory, the storage device and the display, wherein the processor:
receives an image of a target CLD of a target system, wherein the target CLD includes redundant nodes,
determines, using the plurality of reference models, nodes and links of the image of the target CLD,
resolves, using the plurality of reference models, coupling information among the nodes,
extracts a plurality of loop structures from the image of the target CLD using the coupling information,
determines, using the plurality of reference models, specific reference models corresponding to each of the plurality of loop structures
replaces a common portion of each of the plurality of loop structures according to the specific reference models, wherein the common portion is shared by a plurality of loops of each of the plurality of loop structures,
determines an input link that is coupled to a first one of the nodes included in the common portion,
determines a replacement node is one of the nodes included in the common portion,
forms a reference CLD by changing a type of the input link according to a number of the links following the input link until reaching the replacement node in each of types of the links in the plurality of loop structures before the replacement by the replacement node,
uses the reference CLD to enhance the target CLD forming the enhanced CLD,
retrieves the enhanced CLD,
displays, using the display, the plurality of loop structures and the reference models, and
receives an input on whether the plurality of loop structures correspond to the reference models.

2. A data retrieval method that improves performance of retrieving of an enhanced causal loop diagram (CLD), the method comprising:
receiving an image of a target causal loop diagram (CLD) of a target system, wherein the target CLD includes redundant nodes;
retrieving a plurality of reference models from a storage device;
determining, using the plurality of reference models, nodes and links of the image of the target CLD,
resolving, using the plurality of reference models, coupling information among the nodes,
extracting a plurality of loop structures from the image of the target CLD using the coupling information;
determining, using the plurality of reference models, specific reference models corresponding to each of the plurality of loop structures;
replacing a common portion of each of the plurality of loop structures according to the specific reference models, wherein the common portion is shared by a plurality of loops of each of the plurality of the loop structures;
determining an input link that is coupled to a first one of the nodes included in the common portion,
determining a replacement node is one of the nodes included in the common portion,
forming a reference CLD changing a direction of the input link according to a number of the links following the input link until reaching the replacement node in each of directions of the links in the plurality of loop structures before the replacement by the replacement node;
using the reference CLD to enhance the target CLD and form the enhanced CLD;
retrieving the enhanced CLD; and
displaying the enhanced CLD.

3. The method according to claim 2, wherein the method further comprises displaying information on the plurality of loop structures and the reference models on a display screen and receiving an input on whether the plurality of loop structures correspond to the reference models.

4. A non-transitory computer-readable medium containing instructions that when executed by a processor of a data retrieval system cause an improvement in performance of retrieving an enhanced causal loop diagram (CLD) by causing the processor to:
receive an image of a target CLD of a target system, wherein the target CLD includes redundant nodes;
retrieve a plurality of reference models, from a storage device;
determine, using the plurality of reference models, nodes and links of the image of the target CLD,
resolve, using the plurality of reference models, coupling information among the nodes,
extract a plurality of loop structures from the image of the target CLD using the coupling information;
determine, using the plurality of reference models, specific reference models corresponding to each of the plurality of loop structures;
replace a common portion of each of the plurality of loop structures according to the specific reference models, wherein the common portion is shared by a plurality of loops of each of the plurality of the loop structures;
determine an input link that is coupled to a first one of the nodes included in the common portion;
determine a replacement node is one of the nodes included in the common portion;
form a reference CLD by changing a type of the input link according to a number of the links following the input link until reaching the replacement node in each of types of the links in the plurality of loop structures before the replacement by the replacement node;
use the reference CLD to enhance the target CLD and form the enhanced CLD;
retrieve the enhanced CLD; and
display the enhanced CLD.

* * * * *